(12) United States Patent
Berg et al.

(10) Patent No.: US 12,345,780 B1
(45) Date of Patent: Jul. 1, 2025

(54) MITIGATING EXTERNAL MAGNETIC FIELDS ON MAGNETIC ANGLE SENSORS

(71) Applicant: Waymo, LLC, Mountain View, CA (US)

(72) Inventors: Alec Berg, San Mateo, CA (US); Jose Melendez, Mountain View, CA (US); Damien Dusha, Mountain View, CA (US); Alexander Zbrozek, Mountain View, CA (US); Craig Robinson, Santa Clara, CA (US)

(73) Assignee: Waymo LLC, Mountain View, CA (US)

( * ) Notice: Subject to any disclaimer, the term of this patent is extended or adjusted under 35 U.S.C. 154(b) by 929 days.

(21) Appl. No.: 17/308,817

(22) Filed: May 5, 2021

(51) Int. Cl.
| | | |
|---|---|---|
| *G01R 33/025* | (2006.01) |
| *B60R 11/00* | (2006.01) |
| *B60R 11/02* | (2006.01) |
| *G01B 7/30* | (2006.01) |
| *G01R 33/00* | (2006.01) |

(52) U.S. Cl.
CPC ........ *G01R 33/025* (2013.01); *B60R 11/0258* (2013.01); *G01B 7/30* (2013.01); *G01R 33/0094* (2013.01); *B60R 2011/0085* (2013.01)

(58) Field of Classification Search
CPC .. G01R 33/025; G01R 33/0094; G01R 33/09; G01R 33/091; G01D 5/145; G01B 7/30; B60R 11/0258
See application file for complete search history.

(56) References Cited

U.S. PATENT DOCUMENTS

| | | | |
|---|---|---|---|
| 5,341,702 A | 8/1994 | Chaney et al. | |
| 2016/0003641 A1 | 1/2016 | Kaufner | |
| 2018/0123412 A1 | 5/2018 | Karplus et al. | |
| 2018/0302151 A1 | 10/2018 | Rosenband et al. | |
| 2022/0196379 A1* | 6/2022 | Heinz | G01D 5/16 |
| 2022/0268895 A1* | 8/2022 | Entwistle | G01P 3/44 |

FOREIGN PATENT DOCUMENTS

| | | |
|---|---|---|
| EP | 0487681 B1 | 1/1994 |
| WO | 2020186242 A1 | 9/2020 |

OTHER PUBLICATIONS

Fan et al., "KMZ60: Contact less magnet angle sensor," KMZ60 Application Note, NXP B.V., Jan. 24, 2013.

\* cited by examiner

*Primary Examiner* — Reena Aurora
(74) *Attorney, Agent, or Firm* — McDonnell Boehnen Hulbert & Berghoff LLP

(57) ABSTRACT

One example system for determining the orientation of a rotating platform comprises a rotating platform, a first magnetic field sensor configured to sense a magnetic field pointing in a first direction, a second magnetic field sensor configured to sense a magnetic field pointing in a second direction, wherein the second direction is different than the first direction (e.g., opposite the first direction), and at least one magnet producing a local magnetic field. The first magnetic field sensor, the second magnetic field sensor, and the at least one magnet are positioned relative to the rotating platform such that rotation of the rotating platform causes a change in the orientation of the local magnetic field relative to the first magnetic field sensor and the second magnetic field sensor.

19 Claims, 8 Drawing Sheets

MITIGATING EXTERNAL MAGNETIC FIELDS ON MAGNETIC ANGLE SENSORS

BACKGROUND

Autonomous vehicles use various computing systems to aid in the transport of passengers from one location to another. Some autonomous vehicles may require some initial input or continuous input from an operator, such as a pilot, driver, or passenger. Other systems, such as autopilot systems, may be used only when the system has been engaged, which permits the operator to switch from a manual mode (where the operator exercises a high degree of control over the movement of the vehicle) to an autonomous mode (where the vehicle essentially drives itself) to modes that lie somewhere in between.

Such vehicles are equipped with various types of sensors in order to detect the status of the vehicle as well as objects in the surroundings. For example, autonomous vehicles may include inertial sensors, lasers, sonar, radar, cameras, and other devices that scan and record data from the vehicle and its surroundings.

Some sensors are mounted on rotating platforms. The controller of the vehicle detects the orientation of the rotating platform. This can be measured by magnetic sensors. However, an ambient magnetic field can be detected by the magnetic sensors, causing error in the measurement. A moving vehicle can travel through magnetic fields, causing interference with the magnetic sensors that is difficult to predict or detect.

SUMMARY

In one example, a system for determining the orientation of a rotating platform comprises a rotating platform, a first magnetic field sensor configured to sense a magnetic field pointing in a first direction, a second magnetic field sensor configured sense a magnetic field pointing in a second direction, wherein the second direction is different than the first direction (e.g., opposite the first direction), and at least one magnet producing a local magnetic field. The second magnetic field sensor is oriented such that a combined reading of the first and second magnetic field sensors substantially reduces interference from an external magnetic field. The first magnetic field sensor, the second magnetic field sensor, and the at least one magnet are positioned relative to the rotating platform such that rotation of the rotating platform causes a change in the orientation of the local magnetic field relative to the first magnetic field sensor and the second magnetic field sensor.

In some forms, the at least one magnet is mounted proximate to the rotating platform and the first magnetic field sensor and the second magnetic field sensor are mounted on the rotating platform, such that rotation of the rotating platform changes the orientation of the first and second magnetic field sensors within local magnetic field.

In another example, a method of determining the orientation of a rotating platform comprises receiving data from a first magnetic field sensor, comparing the data from the first magnetic field sensor to a first stored value to determine a first estimated orientation or a first estimated change in orientation, receiving data from a second magnetic field sensor, wherein the second magnetic field sensor is configured to sense magnetic fields pointing in a different direction as magnetic fields sensed by the first magnetic field sensor, comparing the data from the second magnetic field sensor to a second stored value to determine a second estimated orientation or a second estimated change in orientation, and averaging the first estimated orientation or change in orientation to the second estimated orientation or change in orientation to determine a change in orientation. The second magnetic field sensor is oriented such that a combined reading of the first and second magnetic field sensors substantially reduces interference from an external magnetic field.

These as well as other aspects, advantages, and alternatives will become apparent to those of ordinary skill in the art by reading the following detailed description with reference where appropriate to the accompanying drawings. Further, it should be understood that the description provided in this summary section and elsewhere in this document is intended to illustrate the claimed subject matter by way of example and not by way of limitation.

DETAILED DESCRIPTION

Figure 1:
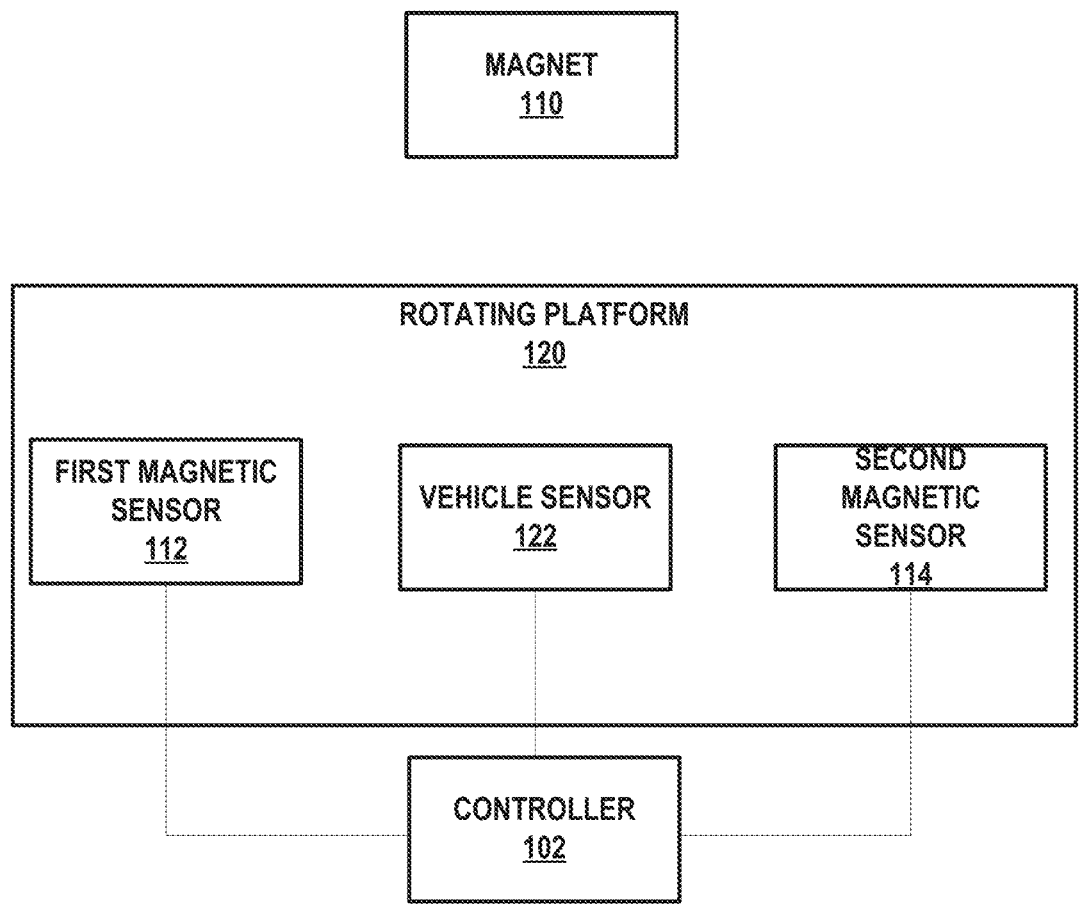
FIG. 1 is a simplified block diagram of a system, according to example embodiments.

Exemplary implementations are described herein. It should be understood that the word "exemplary" is used herein to mean "serving as an example, instance, or illustration." Any implementation or feature described herein as "exemplary" or "illustrative" is not necessarily to be construed as preferred or advantageous over other implementations or features. In the figures, similar symbols typically identify similar components, unless context dictates otherwise. The example implementations described herein are not meant to be limiting. It will be readily understood that the aspects of the present disclosure, as generally described herein, and illustrated in the figures, can be arranged, substituted, combined, separated, and designed in a wide variety of different configurations.

A vehicle, such as an autonomous vehicle, can utilize data from multiple sensors, such as active sensors, such as light detection and ranging (LIDAR) devices and radio detection and ranging (RADAR) devices to generate a representation of a scanned environment. The autonomous vehicle can also utilize passive sensors, such as cameras, microphones, GPS units, passive infrared sensors, inertial sensors, and passive radio frequency sensors. The data from the multiple sensors can be used to detect factors of the vehicle and the environment around the vehicle.

One or more sensors can be mounted on rotating platforms on the vehicle. In order to use data from the sensors on the rotating platform, the controller factors in the orientation of the platform relative to the vehicle. An orientation sensor system is used to detect the orientation of the platform. In example embodiments, the orientation sensor system comprises at least one magnet and at least two magnetic field sensors. Either the at least one magnet or the at least two magnetic field sensors are mounted on the rotating platform, such that rotation of the platform changes the orientation of the magnetic field sensors relative to the field produced by the magnet.

In addition to the magnetic field produced by the magnet, the magnetic field sensors can detect ambient magnetic fields originating outside of the vehicle in the surrounding environment. Due to the relatively long distance between the source of an ambient magnetic field and the rotating platform (compared to the distance between the at least two magnetic sensors), the strength and orientation of the ambient magnetic field is substantially similar at each of the at least two magnetic sensors.

The at least two magnetic field sensors include a first magnetic sensor oriented to sense a magnetic field in a first direction, and a second magnetic field sensor oriented to sense a magnetic field in a second, opposite direction. For example, the first magnetic field sensor can be oriented to detect a magnetic field pointing to the driver side of the vehicle and the second magnetic field sensor can be oriented to detect a magnetic field pointing to the passenger side of the vehicle. Orienting the second magnetic field sensor in this manner substantially reduces changes from an ambient magnetic field when readings from the first and second magnetic field sensors are combined. In some embodiments, substantially reducing changes means reducing the effect of the ambient magnetic field on the reading by at least about 50%. In some examples, substantially reducing changes means reducing the effect of the ambient magnetic field on the reading by at least about 90%.

An ambient magnetic field acts on the first and second magnetic sensors in opposite directions. In the above example, an ambient magnetic field pointing towards the front of the vehicle would cause error in the clockwise direction for the first magnetic field sensor and a substantially similar amount of error in the counter-clockwise direction for the second magnetic field sensor. Accordingly, averaging the readings of the first and second magnetic field sensors substantially eliminates the error caused by the ambient magnetic field.

FIG. 1 illustrates a system 100 having a controller 102, at least one magnet 110, a first magnetic field sensor 112, a second magnetic field sensor 114, a rotating platform 120, and a vehicle sensor 122. The vehicle sensor 122 may include one or more sensors used in operation of a vehicle, such as a LIDAR sensor, inertial sensor, and/or other type of sensor. The vehicle sensor 122 is mounted on the rotating platform 120 such that the vehicle sensor 122 is movable relative to the vehicle.

As shown, the first and second magnetic field sensors 112, 114 are mounted on the rotating platform 120 and the at least one magnet 110 is mounted proximate to the rotating platform 120. Rotation of the rotating platform 120 causes the first and second magnetic field sensors 112, 114 to move relative to the magnet, such that the magnetic field sensed by the sensors 112, 114 changes. In alternative form, the at least one magnet 110 is mounted on the rotating platform 120 and the first and second magnetic field sensors 112, 114 are mounted proximate to the rotating platform such that rotating the platform still causes a relative movement between the magnetic field and the magnetic field sensors 112, 114.

In some examples, the first magnetic field sensor 112 and second magnetic field sensor 114 are magnetoresistive sensors. Magnetoresistive sensors are formed of a ferromagnetic alloy. When current is applied through a magnetoresistive sensor in a first direction, and the magnetoresistive sensor is placed in an external magnetic field, the resistance of the magnetoresistive sensor is based on the angle between the direction of the magnetic field and the direction of the current. Accordingly, a change in the direction of the magnetic field causes the resistance in the magnetoresistive sensor to change. The angle between the magnetic field and the current can be calculated based on the resistance of the magnetoresistive sensor.

Figure 2:
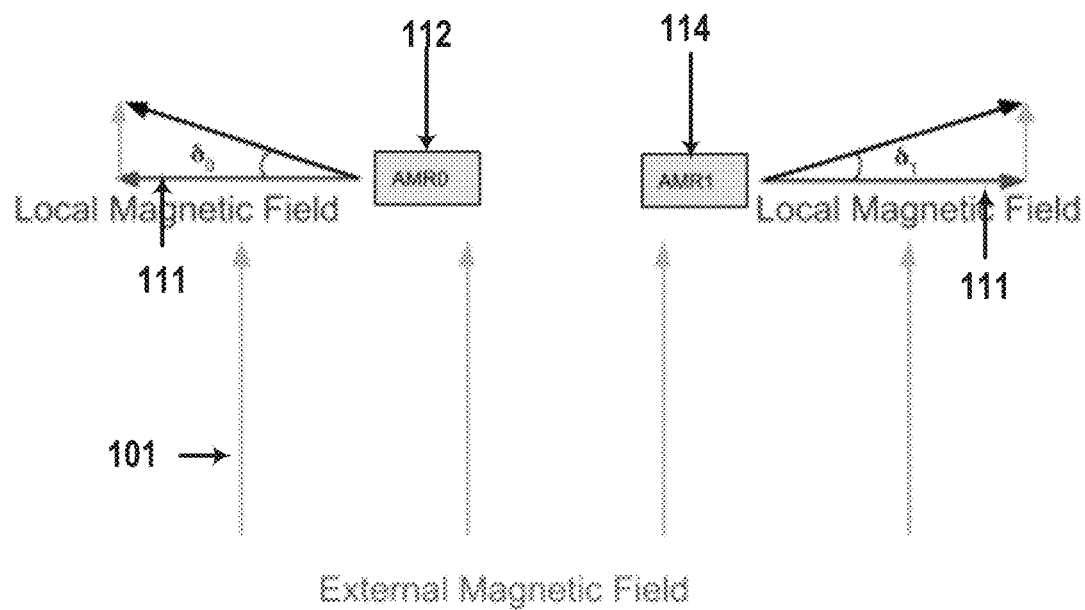
FIG. 2 illustrates the magnetic field sensors from the system of FIG. 1 in an external magnetic field.

The direction of the magnetic field caused by the at least one magnet 110 and any ambient magnetic fields combine to form a net magnetic field having a direction. FIG. 2 illustrates a simplified example of the first magnetic field sensor 112 and the second magnetic field sensor 114 in an area containing both a local magnetic field 111, such as from the at least one magnet 110, and an ambient or external magnetic field 101. As shown, the local magnetic field 111 acts on the first magnetic field sensor 112 and the second magnetic field sensor 114 in opposite directions (to the left of the figure for the first magnetic field sensor 112 and the right of the figure for the second magnetic field sensor 114). In contrast, the external magnetic field 101 acts upon the sensors 112, 114 in the same direction, towards the top of the page.

The combined direction of the local magnetic field 111 and the external magnetic field differs from the direction of the local magnetic field by $\delta_0$ on the first magnetic field sensor 112 and $\delta_1$ on the second magnetic field sensor 114. Because of the relatively large distance between the system and the source of the external magnetic field 101, the amplitude and direction of the external magnetic field 101 is substantially equal at the location of the first magnetic field sensor 112 and the location of the second magnetic field sensor 114. Accordingly $\delta_0$ is substantially equal to $-\delta_1$. Thus, when the controller 102 averages the measurements of the first magnetic field sensor 112 and the second magnetic field sensor 114 $\delta_0$ and $\delta_1$ substantially cancel out.

In some examples, the at least one magnet 110 used is a radial ring magnet. For example, the radial ring magnet 110 can be centered on the axis of rotation of the rotating platform 120 with the first magnetic sensor 112 and the second magnetic sensor 114 positioned radially outward from the radial ring magnet 110.

Figure 3:
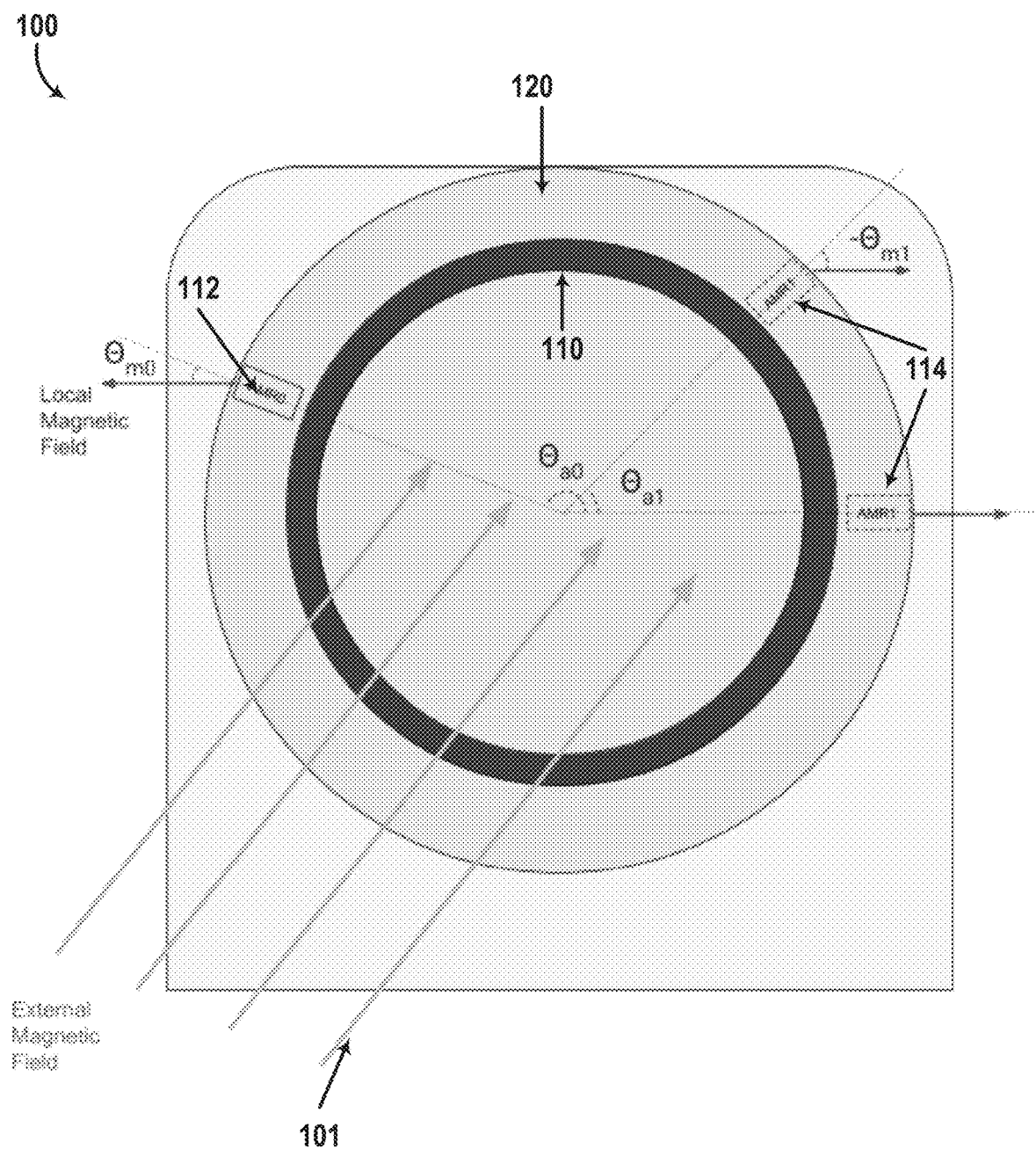
FIG. 3 illustrates the system of FIG. 1 showing potential locations of the magnetic field sensors.
Figure 4A:
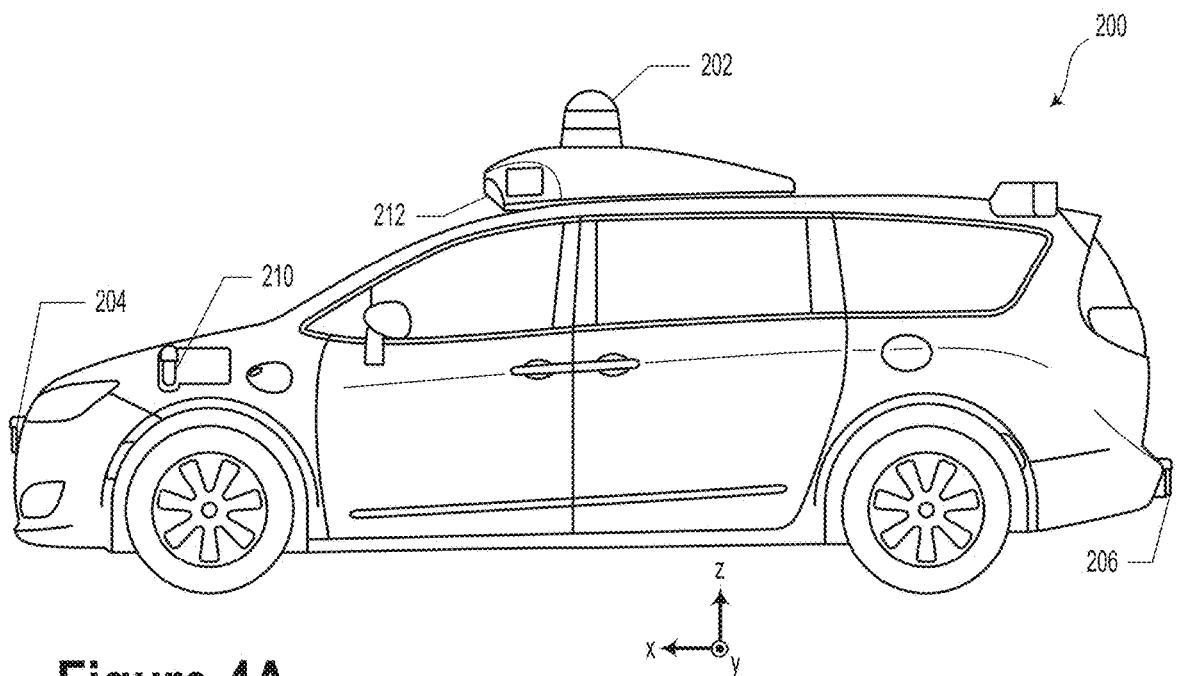
FIG. 4A illustrates a vehicle equipped with a sensor system, according to an example embodiment.
Figure 4B:
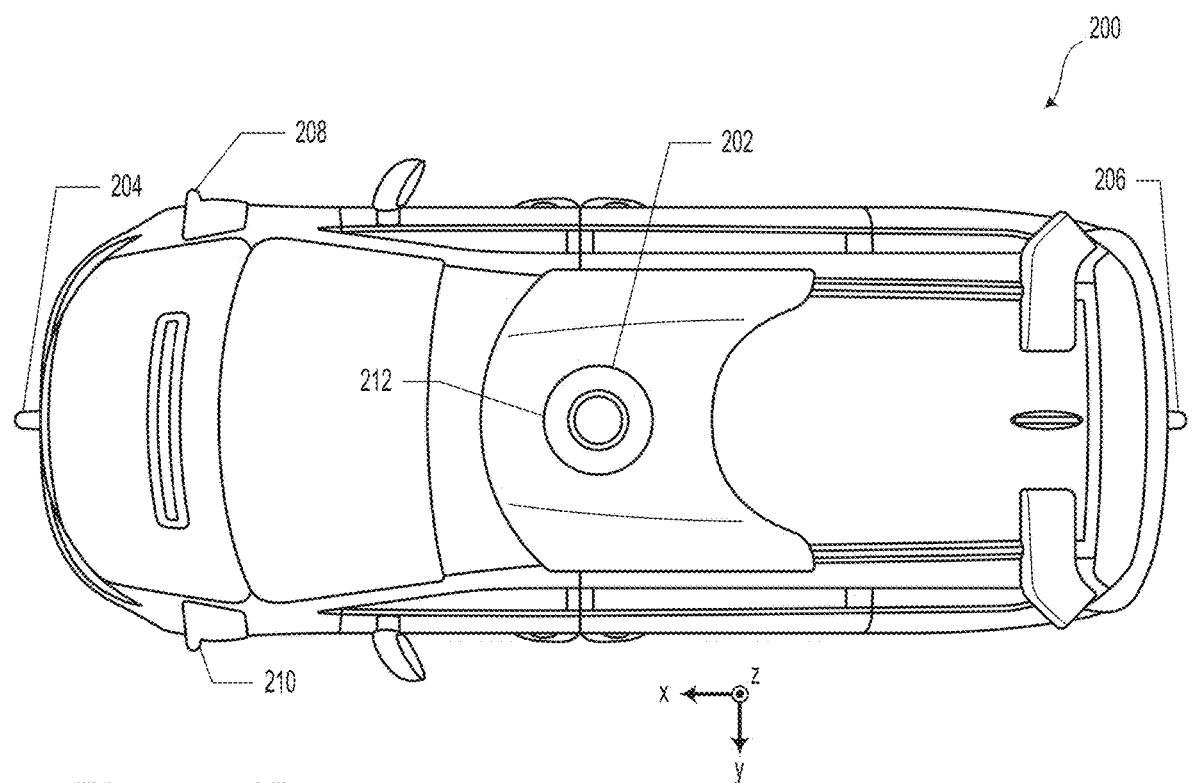
FIG. 4B illustrates a vehicle equipped with a sensor system, according to an example embodiment.
Figure 4C:
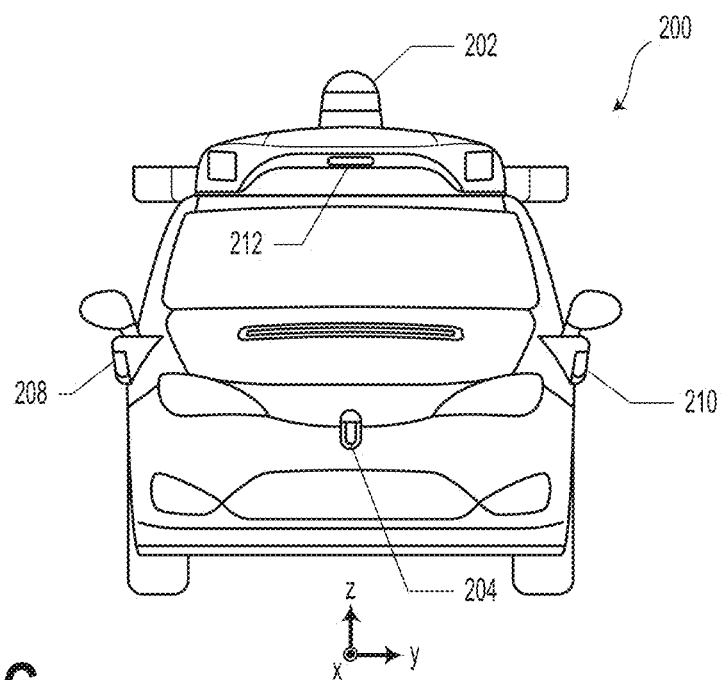
FIG. 4C illustrates a vehicle equipped with a sensor system, according to an example embodiment.
Figure 4D:
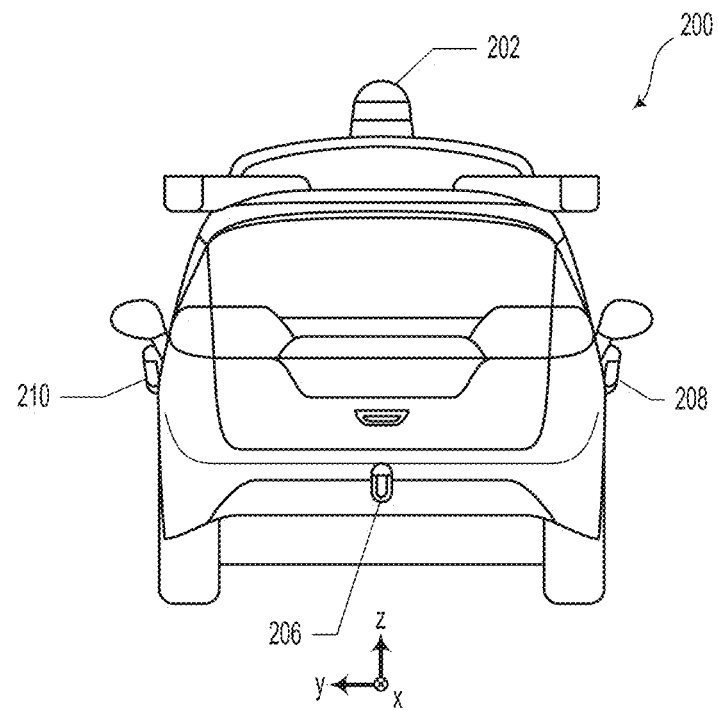
FIG. 4D illustrates a vehicle equipped with a sensor system, according to an example embodiment.
Figure 4E:
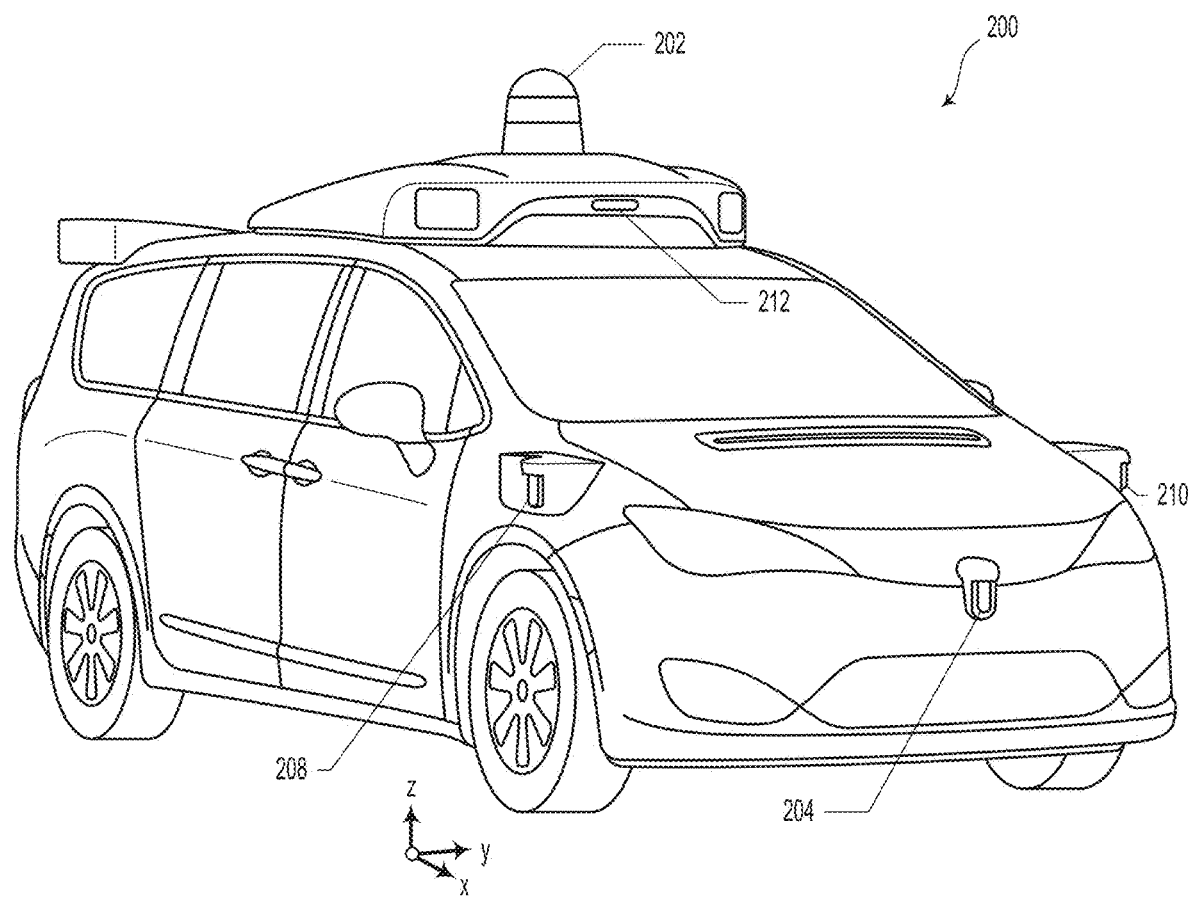
FIG. 4E illustrates a vehicle equipped with a sensor system, according to an example embodiment.

FIG. 3 illustrates the system 100 having a rotating platform 120, at least one magnet 110, a first magnetic field sensor 112, and a second magnetic field sensor 114. The second magnetic field sensor 114 is shown at two possible locations on the rotating platform to better illustrate how to orient the magnetic sensors so the magnetic fields that the two sensors experience is pointing in opposite directions.

The first magnetic field sensor 112 is physically spaced from second magnetic field sensor 114 along the circumference of the rotating platform 110 by an angle of $\Theta_a$. The first magnetic field sensor 112 and the second magnetic field sensor 114 also have a magnetic angular difference based on the direction of the current flowing through the sensors 112, 114 between the two terminals. More specifically, current traveling through the sensors 112, 114 will be redirected by an ambient magnetic field. The total amount of current within the sensors 112, 114 doesn't change, but the fraction traveling in given direction changes. In order to be oriented so as to detect magnetic fields pointing in opposite directions, the sum $\Theta_a+\Theta_m$ is equal to 180 degrees.

As discussed above, the at least one magnet 110 is a radial ring magnet in which the poles point radially outward from the ring. A radial ring magnet has a number of pole pairs. The potential locations and orientations ($\Theta_a$ and $\Theta_m$) of the second magnetic field sensor 114 relative to the first magnetic field sensor 112 is based in part on the number of pole pairs. The following equations can be solved to provide the $\Theta_a$ and $\Theta_m$ values, wherein P is the number of pole pairs and % represents modulo division:

$$(\Theta_a+\Theta_m)\%360=180 \quad\quad 1.$$

$$\Theta_m=(P*\Theta_a)\%360 \quad\quad 2.$$

Alternatively, the angles can be derived from the equation by solving for different values of k (k=0:P+1):

$$\cos(180+k*360)=-1=(P+1)*\Theta \quad\quad 3.$$

Equation 3 is first solved for the same direction values, or $\Theta_a$ using the following equations.

$$0=\sin((P+1)*\Theta_a) \quad\quad 4.$$

$$a\sin(0)=(P+1)*\Theta_a \quad\quad 5.$$

$$(2*pi*k)/(P+1) \quad\quad 6.$$

Equation 3 is then solved for the opposite direction values, or $\Theta_m$ using the following equations.

$$-1=\cos((P+1)*\Theta_m) \quad\quad 7.$$

$$a\cos(-1)=(P+1)*\Theta_m \quad\quad 8.$$

$$((2*pi*k)+pi)/(P+1) \quad\quad 9.$$

In one example, the at least one magnet 110 has 21 pole pairs. Solving equations 1 and 2 or equations 3 through 9 for P=21 provides the following values of $\Theta_a$ and $\Theta_m$. Note that equations 3 through 9 provide results in radians, which have been converted to degrees in the table below.

| $\Theta_a$ | $\Theta_m$ |
|---|---|
| 8.1818 | 171.8181 |
| 24.5554 | 155.4545 |
| 40.9190 | 139.0909 |
| 57.2727 | 122.7273 |
| 73.6463 | 106.3636 |
| 90 | 90 |
| 106.3636 | 73.6364 |
| 122.7272 | 57.2727 |
| 139.0909 | 40.9090 |
| 155.4545 | 24.5454 |
| 171.8182 | 8.818 |
| 188.1818 | 351.8181 |
| 204.5554 | 335.4545 |
| 220.9091 | 319.0909 |
| 237.2727 | 302.7272 |
| 253.6364 | 286.3636 |
| 270 | 270 |
| 286.3636 | 253.6363 |
| 302.7272 | 237.2727 |
| 319.0909 | 220.9090 |
| 335.4545 | 204.5454 |
| 351.8182 | 188.1818 |

In some examples, the angle $\Theta_a$ between the first magnetic field sensor 112 and the second magnetic field sensor 114 is between approximately 120 degrees and approximately 130 degrees. In one example, $\Theta_a$ is approximately 122.7272 degrees.

The system 100 described above is a sensor system configured to detect information relating to a vehicle or the environment around the vehicle. In some examples, the system 100 is used within an autonomous vehicle to aid in navigation and operation of the vehicle. FIGS. 4A, 4B, 4C, 4D, and 4E illustrate a vehicle 200, according to an example embodiment. In some embodiments, the vehicle 200 could be a semi- or fully-autonomous vehicle. While FIGS. 4A, 4B, 4C, 4D, and 4E illustrates vehicle 200 as being an automobile (e.g., a passenger van), it will be understood that vehicle 200 could include another type of autonomous vehicle, robot, or drone that can navigate within its environment using sensors and other information about its environment.

In some examples, the vehicle 200 may include one or more sensor systems 202, 204, 206, 208, 210, and 212. In some embodiments, sensor systems 202, 204, 206, 208, 210, and/or 212 could include the vehicle sensor 122 mounted on a rotating platform as illustrated and described in relation to FIG. 1. In other words, the systems described elsewhere herein could be coupled to the vehicle 200 and/or could be utilized in conjunction with various operations of the vehicle 200. As an example, the system 100 could be utilized to detect the orientation of a rotating platform onto which sensor systems 202, 204, 206, 208, 210, and/or 212 are mounted.

While the one or more sensor systems 202, 204, 206, 208, 210, and 212 are illustrated on certain locations on vehicle 200, it will be understood that more or fewer sensor systems could be utilized with vehicle 200. Furthermore, the locations of such sensor systems could be adjusted, modified, or otherwise changed as compared to the locations of the sensor systems illustrated in FIGS. 4A, 4B, 4C, 4D, and 4E.

One or more of the sensor systems 202, 204, 206, 208, 210, and/or 212 could include LIDAR sensors. For example, the LIDAR sensors could include a plurality of light-emitter devices arranged over a range of angles with respect to a given plane (e.g., the x-y plane). For example, one or more of the sensor systems 202, 204, 206, 208, 210, and/or 212 may be configured to rotate about an axis (e.g., the z-axis) perpendicular to the given plane so as to illuminate an environment around the vehicle 200 with light pulses. Based on detecting various aspects of reflected light pulses (e.g., the elapsed time of flight, polarization, intensity, etc.), information about the environment may be determined.

The vehicle 200 may also include additional types of sensors mounted on the exterior thereof, such as the temperature sensor, sound sensor, LIDAR sensor, RADAR sensor, SONAR sensor, and/or cameras described above. Each of these additional types of sensors would be communicably coupled to computer readable memory. The vehicle 200 may further include sensors mounted internally, such as inertial sensors. The inertial sensors can similarly be mounted on a rotating platform with the system 100.

Figure 5:
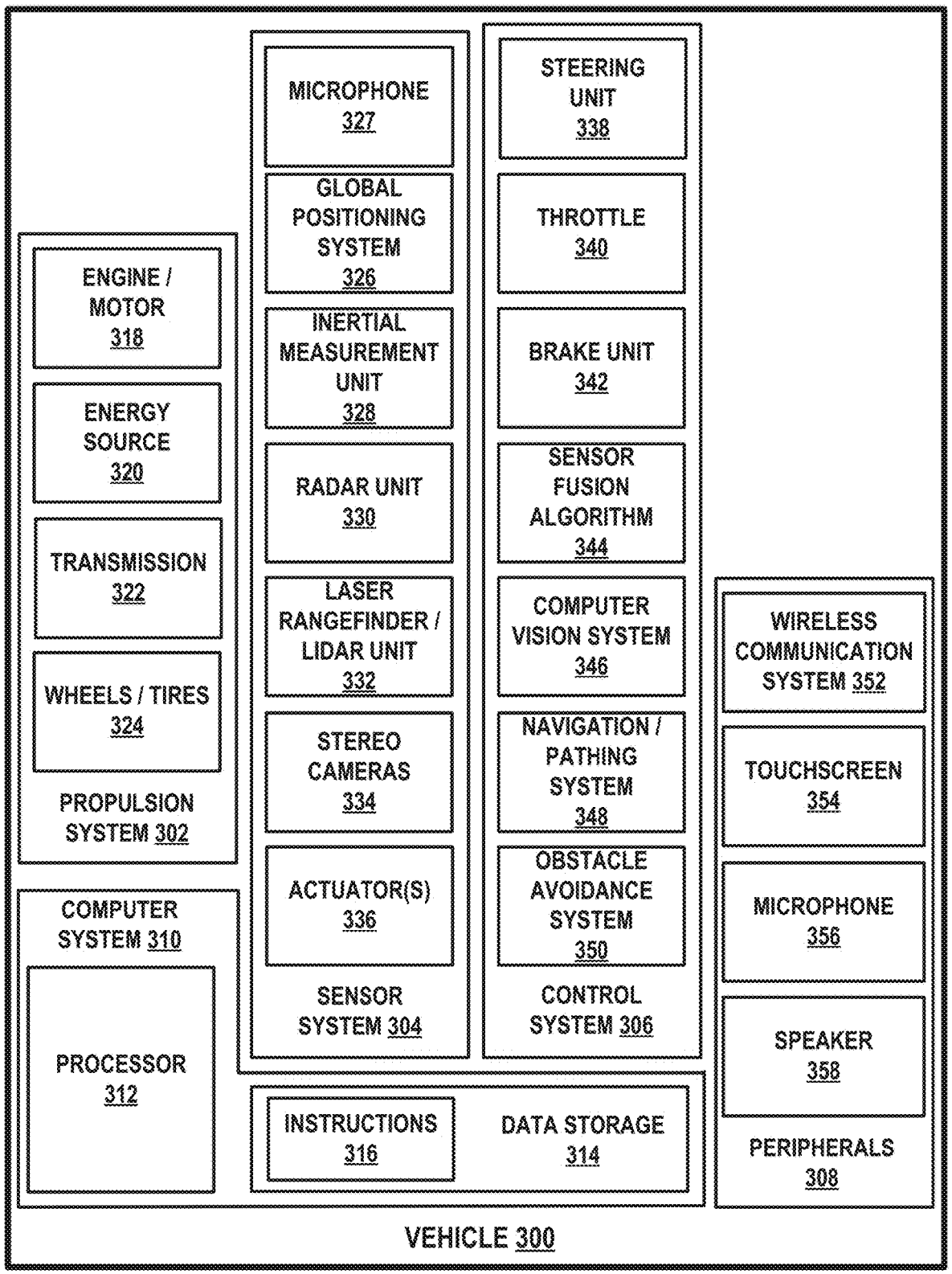
FIG. 5 is a simplified block diagram of a vehicle, according to example embodiments.

FIG. 5 is a simplified block diagram of a vehicle 300, according to an example embodiment. As shown, the vehicle 300 includes a propulsion system 302, a sensor system 304, a control system 306, peripherals 308, and a computer system 310. In some embodiments, vehicle 300 may include more, fewer, or different systems, and each system may include more, fewer, or different components. Additionally, the systems and components shown may be combined or divided in any number of ways. For instance, control system 306 and computer system 310 may be combined into a single system.

Propulsion system 302 may be configured to provide powered motion for the vehicle 300. To that end, as shown, propulsion system 302 includes an engine/motor 318, an energy source 320, a transmission 322, and wheels/tires 324.

The engine/motor 318 may be or include any combination of an internal combustion engine, an electric motor, a steam engine, and a Sterling engine. Other motors and engines are possible as well. In some embodiments, propulsion system 302 may include multiple types of engines and/or motors. For instance, a gas-electric hybrid car may include a gasoline engine and an electric motor. Other examples are possible.

Energy source 320 may be a source of energy that powers the engine/motor 318 in full or in part. That is, engine/motor 318 may be configured to convert energy source 320 into mechanical energy. Examples of energy sources 320 include gasoline, diesel, propane, other compressed gas-based fuels, ethanol, solar panels, batteries, and other sources of electrical power. Energy source(s) 320 may additionally or alternatively include any combination of fuel tanks, batteries, capacitors, and/or flywheels. In some embodiments, energy source 320 may provide energy for other systems of the vehicle 300 as well. To that end, energy source 320 may additionally or alternatively include, for example, a rechargeable lithium-ion or lead-acid battery. In some embodiments, energy source 320 may include one or more banks of batteries configured to provide the electrical power to the various components of vehicle 300.

Transmission 322 may be configured to transmit mechanical power from the engine/motor 318 to the wheels/tires 324. To that end, transmission 322 may include a gearbox, clutch, differential, drive shafts, and/or other elements. In embodiments where the transmission 322 includes drive shafts, the drive shafts may include one or more axles that are configured to be coupled to the wheels/tires 324.

Wheels/tires 324 of vehicle 300 may be configured in various formats, including a unicycle, bicycle/motorcycle, tricycle, or car/truck four-wheel format. Other wheel/tire formats are possible as well, such as those including six or more wheels. In any case, wheels/tires 324 may be configured to rotate differentially with respect to other wheels/tires 324. In some embodiments, wheels/tires 324 may include at least one wheel that is fixedly attached to the transmission 322 and at least one tire coupled to a rim of the wheel that could make contact with the driving surface. Wheels/tires 324 may include any combination of metal and rubber, or combination of other materials. Propulsion system 302 may additionally or alternatively include components other than those shown.

Sensor system 304 may include a number of sensors configured to sense information about an environment in which the vehicle 300 is located, as well as one or more actuators 336 configured to modify a position and/or orientation of the sensors. The sensor system 304 further includes computer readable memory which receives and stores data from the sensors. As shown, sensor system 304 includes a microphone 327, a Global Positioning System (GPS) 326, an inertial measurement unit (IMU) 328, a RADAR unit 330, a laser rangefinder and/or LIDAR unit 332, and a stereo camera system 334. Sensor system 304 may include additional sensors as well, including, for example, sensors that monitor internal systems of the vehicle 300 (e.g., an $O_2$ monitor, a fuel gauge, an engine oil temperature, etc.). Other sensors are possible as well.

The sensor system 304 can include the vehicle sensor 122 of the system 100 described above. In some examples, the sensor system 304 includes one or more sensors mounted on a rotating platform 120.

The microphone module 327 may be any sensor (e.g., acoustic sensor) configured to detect and record sounds originating outside of the vehicle 300.

GPS 326 may be any sensor (e.g., location sensor) configured to estimate a geographic location of vehicle 300. To this end, the GPS 326 may include a transceiver configured to estimate a position of the vehicle 300 with respect to the Earth.

IMU 328 may be any combination of sensors configured to sense position and orientation changes of the vehicle 300 based on inertial acceleration. In some embodiments, the combination of sensors may include, for example, accelerometers, gyroscopes, compasses, etc. In some forms, the IMU 328 is mounted on the rotating platform 120 described above.

RADAR unit 330 may be any sensor configured to sense objects in the environment in which the vehicle 300 is located using radio signals. In some embodiments, in addition to sensing the objects, RADAR unit 330 may additionally be configured to sense the speed and/or heading of the objects.

Similarly, laser range finder or LIDAR unit 332 may be any sensor configured to sense objects in the environment in which vehicle 300 is located using lasers. For example, LIDAR unit 332 may include one or more LIDAR devices, at least some of which may take the form of devices 100 and/or 200 among other LIDAR device configurations, for instance.

The stereo cameras 334 may be any cameras (e.g., a still camera, a video camera, etc.) configured to capture images of the environment in which the vehicle 300 is located.

Control system 306 may be configured to control one or more operations of vehicle 300 and/or components thereof. To that end, control system 306 may include a steering unit 338, a throttle 340, a brake unit 342, a sensor fusion algorithm 344, a computer vision system 346, navigation or pathing system 348, and an obstacle avoidance system 350. In some examples, the control system 306 includes a controller configured to receive data from the first and second magnetic field sensors 112, 114 and average the readings to substantially eliminate the error caused by ambient magnetic fields, such as the controller 102 described above.

Steering unit 338 may be any combination of mechanisms configured to adjust the heading of vehicle 300. Throttle 340 may be any combination of mechanisms configured to control engine/motor 318 and, in turn, the speed of vehicle 300. Brake unit 342 may be any combination of mechanisms configured to decelerate vehicle 300. For example, brake unit 342 may use friction to slow wheels/tires 324. As another example, brake unit 342 may convert kinetic energy of wheels/tires 324 to an electric current.

Sensor fusion algorithm 344 may be an algorithm (or a computer program product storing an algorithm) configured to accept data from sensor system 304 as an input. The sensor fusion algorithm 344 is operated on a processor, such as the external processor discussed above. The data may include, for example, data representing information sensed by sensor system 304. Sensor fusion algorithm 344 may include, for example, a Kalman filter, a Bayesian network, a machine learning algorithm, an algorithm for some of the functions of the methods herein, or any other sensor fusion algorithm. Sensor fusion algorithm 344 may further be configured to provide various assessments based on the data from sensor system 304, including, for example, evaluations of individual objects and/or features in the environment in which vehicle 300 is located, evaluations of particular situations, and/or evaluations of possible impacts based on particular situations. Other assessments are possible as well.

Computer vision system 346 may be any system configured to process and analyze images captured by stereo cameras 334 in order to identify objects and/or features in the environment in which vehicle 300 is located, including, for example, traffic signals and obstacles. To that end, computer vision system 346 may use an object recognition algorithm, a Structure from Motion (SFM) algorithm, video tracking, or other computer vision techniques. In some embodiments, computer vision system 346 may additionally be configured to map the environment, track objects, estimate the speed of objects, etc.

Navigation and pathing system 348 may be any system configured to determine a driving path for vehicle 300. Navigation and pathing system 348 may additionally be configured to update a driving path of vehicle 300 dynamically while vehicle 300 is in operation. In some embodiments, navigation and pathing system 348 may be configured to incorporate data from sensor fusion algorithm 344, GPS 326, microphone 327, LIDAR unit 332, and/or one or more predetermined maps so as to determine a driving path for vehicle 300.

Obstacle avoidance system 350 may be any system configured to identify, evaluate, and avoid or otherwise negotiate obstacles in the environment in which vehicle 300 is located. Control system 306 may additionally or alternatively include components other than those shown.

Peripherals 308 may be configured to allow vehicle 300 to interact with external sensors, other vehicles, external computing devices, and/or a user. To that end, peripherals 308 may include, for example, a wireless communication system 352, a touchscreen 354, a microphone 356, and/or a speaker 358.

Wireless communication system 352 may be any system configured to wirelessly couple to one or more other vehicles, sensors, or other entities, either directly or via a communication network. To that end, wireless communication system 352 may include an antenna and a chipset for communicating with the other vehicles, sensors, servers, or other entities either directly or via a communication network. The chipset or wireless communication system 352 in general may be arranged to communicate according to one or more types of wireless communication (e.g., protocols) such as Bluetooth, communication protocols described in IEEE 802.11 (including any IEEE 802.11 revisions), cellular technology (such as GSM, CDMA, UMTS, EV-DO, WiMAX, or LTE), Zigbee, dedicated short range communications (DSRC), and radio frequency identification (RFID) communications, among other possibilities.

Touchscreen 354 may be used by a user to input commands to vehicle 300. To that end, touchscreen 354 may be configured to sense at least one of a position and a movement of a user's finger via capacitive sensing, resistance sensing, or a surface acoustic wave process, among other possibilities. Touchscreen 354 may be capable of sensing finger movement in a direction parallel or planar to the touchscreen surface, in a direction normal to the touchscreen surface, or both, and may also be capable of sensing a level of pressure applied to the touchscreen surface. Touchscreen 354 may be formed of one or more translucent or transparent insulating layers and one or more translucent or transparent conducting layers. Touchscreen 354 may take other forms as well.

Microphone 356 may be configured to receive audio (e.g., a voice command or other audio input) from a user of vehicle 300. Similarly, speakers 358 may be configured to output audio to the user.

Computer system 310 may be configured to transmit data to, receive data from, interact with, and/or control one or more of propulsion system 302, sensor system 304, control system 306, and peripherals 308. To this end, computer system 310 may be communicatively linked to one or more of propulsion system 302, sensor system 304, control system 306, and peripherals 308 by a system bus, network, and/or other connection mechanism (not shown).

In one example, computer system 310 may be configured to control operation of transmission 322 to improve fuel efficiency. As another example, computer system 310 may be configured to cause camera 334 to capture images of the environment. As yet another example, computer system 310 may be configured to store and execute instructions corresponding to sensor fusion algorithm 344. As still another example, computer system 310 may be configured to store and execute instructions for determining a 3D representation of the environment around vehicle 300 using LIDAR unit 332. Thus, for instance, computer system 310 could function as a controller for LIDAR unit 332. Other examples are possible as well.

As shown, computer system 310 includes processor 312 and data storage 314. Processor 312 may comprise one or more general-purpose processors and/or one or more special-purpose processors. To the extent that processor 312 includes more than one processor, such processors could work separately or in combination.

In some examples, the computer system 310 is configured to execute instructions stored in computer readable memory which one or more processors to control sensors in the sensor system 304 to schedule data transmissions to avoid data loss as the result of memory blackout events. Alternatively or additionally, the instructions cause one or more processors to control computer readable memory to schedule memory blackout events to avoid data loss during the memory blackout events.

Data storage 314, in turn, may comprise one or more volatile and/or one or more non-volatile storage components, such as optical, magnetic, and/or organic storage, and data storage 314 may be integrated in whole or in part with processor 312. In some embodiments, data storage 314 may contain instructions 316 (e.g., program logic) executable by processor 312 to cause vehicle 300 and/or components thereof (e.g., LIDAR unit 332, etc.) to perform the various operations described herein. Data storage 314 may contain additional instructions as well, including instructions to transmit data to, receive data from, interact with, and/or control one or more of propulsion system 302, sensor system 304, control system 306, and/or peripherals 308.

In some embodiments, vehicle 300 may include one or more elements in addition to or instead of those shown. For example, vehicle 300 may include one or more additional interfaces and/or power supplies. Other additional components are possible as well. In such embodiments, data storage 314 may also include instructions executable by processor 312 to control and/or communicate with the additional components. Still further, while each of the components and systems are shown to be integrated in vehicle 300, in some embodiments, one or more components or systems may be removably mounted on or otherwise connected (mechanically or electrically) to vehicle 300 using wired or wireless connections. Vehicle 300 may take other forms as well.

Figure 6:
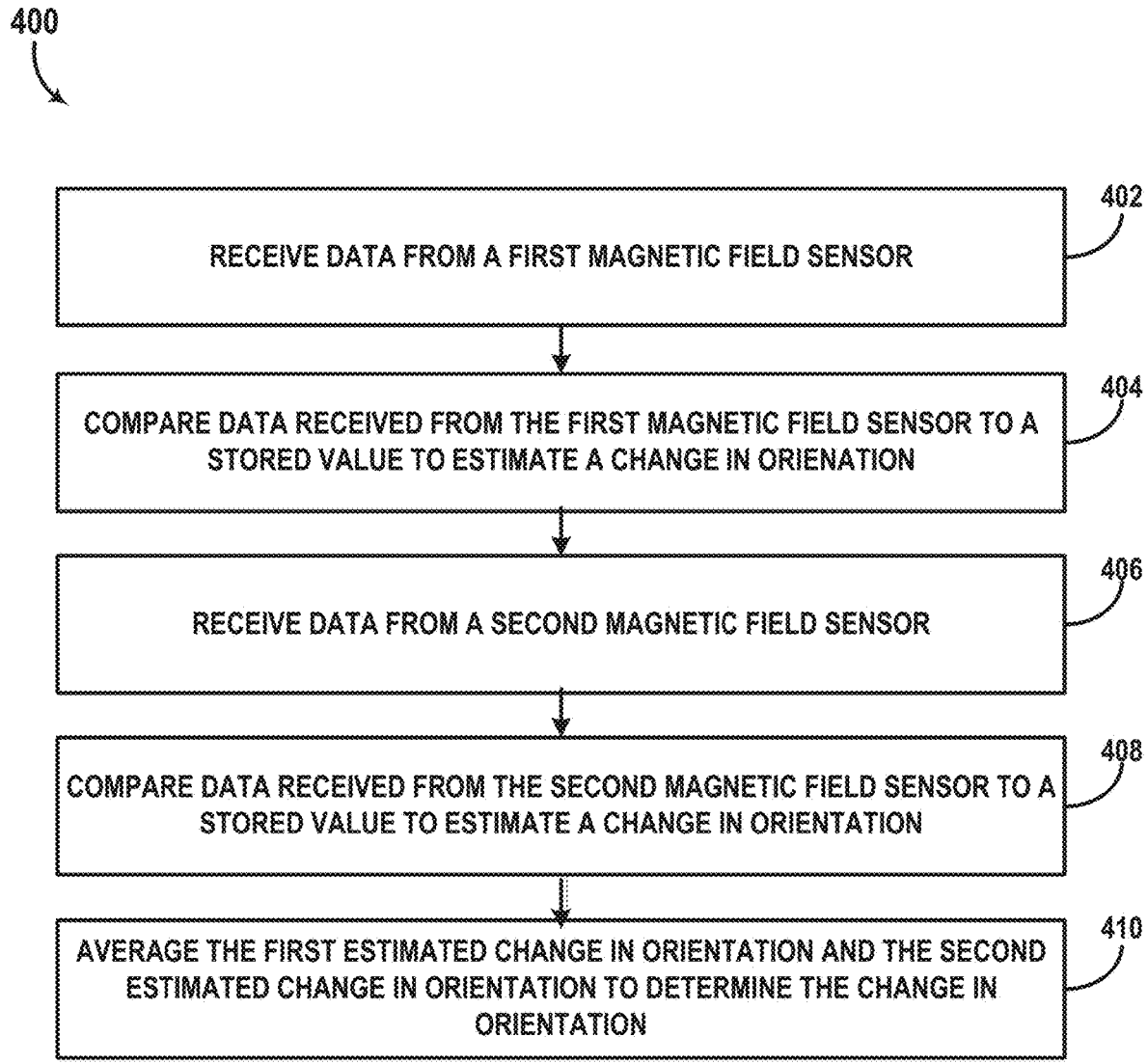
FIG. 6 is a flowchart of a method, according to example embodiments.

FIG. 6 is a flowchart of a method 400, according to example embodiments. The method 400 presents an embodiment of a method that could be used with the system 100 or the vehicles 200 and 300, for example. Method 400 may include one or more operations, functions, or actions as illustrated by one or more of blocks 402-410. Although the blocks are illustrated in a sequential order, these blocks may in some instances be performed in parallel, and/or in a different order than those described herein. Also, the various blocks may be combined into fewer blocks, divided into additional blocks, and/or removed based upon the desired implementation.

The method 400 is a method of determining the orientation of a rotating platform. More specifically, the method 400 is a method of reducing error caused by external magnetic fields when measuring the orientation of a rotating platform using magnetoresistive sensors.

In addition, for method 400 and other processes and methods disclosed herein, the flowchart shows functionality and operation of one possible implementation of present embodiments. In this regard, each block may represent a module, a segment, a portion of a manufacturing or operation process, or a portion of program code, which includes one or more instructions executable by a processor for implementing specific logical functions or steps in the process. The program code may be stored on any type of computer readable medium, for example, such as a storage device including a disk or hard drive.

The computer readable medium may include a non-transitory computer readable medium, for example, such as computer-readable media that stores data for short periods of time like register memory, processor cache and Random Access Memory (RAM). The computer readable medium may also include non-transitory media, such as secondary or persistent long term storage, like read only memory (ROM), optical or magnetic disks, compact-disc read only memory (CD-ROM), for example. The computer readable media may also be any other volatile or non-volatile storage systems. The computer readable medium may be considered a computer readable storage medium, for example, or a tangible storage device. In addition, for method 400 and other processes and methods disclosed herein, each block in FIG. 6 may represent circuitry that is wired to perform the specific logical functions in the process.

At block 402, the method 400 includes receiving data from a first magnetic field sensor. The data may represent an angle between the magnetic field and the internal current within the sensor or a value from which the angle can be determined, such as the resistance, voltage, or current of the sensor.

At block 404, the method 400 involves comparing the data from the first magnetic field sensor to a stored value to determine a change in the direction of the magnetic field relative to the first magnetic field sensor. The stored value may be a baseline value representing the orientation of the rotating platform as a standard or unrotated state. Alternatively, the stored value is an earlier measured value such that movement can be tracked overtime by comparing new value to previous values.

At block 406, the method includes receiving data from a second magnetic field sensor, wherein the second magnetic field sensor is oriented to detect magnetic fields pointing in a different direction as those detected by the first magnetic field sensor. In one example, the second magnetic field sensor is oriented to detect magnetic fields pointing in the opposite direction as those detected by the first magnetic field sensor. The data may represent an angle between the magnetic field and the internal current within the sensor or a value from which the angle can be determined, such as the resistance, voltage, or current of the sensor.

At block 408, the method 400 involves comparing the data from the second magnetic field sensor to a stored value to determine a change in the direction of the magnetic field relative to the second magnetic field sensor. The stored value may be a baseline value representing the orientation of the rotating platform as a standard or unrotated state. Alternatively, the stored value is an earlier measured value such that movement can be tracked overtime by comparing new value to previous values.

At block 410, the controller averages the change in direction determined in step 404 and the change in direction determined in step 408 to determine a change in orientation of the rotating platform.

The above examples of systems and methods for determining the orientation of a rotating platform involve sensor systems and specifically sensor systems for autonomous vehicles. The methods and systems allow for the use of highly sensitive magnetoresistive sensors without ferromagnetic cages by reducing error from ambient magnetic fields through the use of at least two magnetic field sensors. It is understood that the systems and methods should not be limited to sensor systems or to autonomous vehicles. The systems and methods for determining the orientation of a rotating platform can be used in other systems having a rotating component, particularly those that may be in the presence of ambient magnetic fields.

The particular arrangements shown in the Figures should not be viewed as limiting. It should be understood that other implementations may include more or less of each element shown in a given Figure. Further, some of the illustrated elements may be combined or omitted. Yet further, an exemplary implementation may include elements that are not illustrated in the Figures. Additionally, while various aspects and implementations have been disclosed herein, other aspects and implementations will be apparent to those skilled in the art. The various aspects and implementations disclosed herein are for purposes of illustration and are not intended to be limiting, with the true scope and spirit being indicated by the following claims. Other implementations may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations.

What is claimed:

1. A system comprising:
   a rotating platform having an axis of rotation;
   at least one magnet producing a local magnetic field;
   a first magnetic field sensor; and
   a second magnetic field sensor, wherein the first magnetic field sensor is circumferentially spaced from the second magnetic field sensor by an angle $\Theta_a$, the first magnetic field sensor and the second magnetic field sensor have a magnetic angular difference of $\Theta_m$, and $\Theta_a + \Theta_m$ is substantially equal to 180 degrees such that a combined reading of the first and second magnetic field sensors substantially reduces the influence of an external magnetic field on a measurement of the local magnetic field, and
   wherein the at least one magnet or both the first magnetic field sensor and the second magnetic field sensor are coupled to the rotating platform.

2. The system of claim 1 further comprising a vehicle sensor mounted on the rotating platform.

3. The system of claim 2, wherein the vehicle sensor comprises at least one of an inertial sensor, a LIDAR sensor, a SONAR sensor, or a RADAR sensor.

4. The system of claim 1, wherein the first magnetic field sensor comprises a magnetoresistive sensor.

5. The system of claim 1, wherein the at least one magnet comprises a radial ring magnet.

6. The system of claim 1, wherein the first magnetic field sensor and the second magnetic field sensor are mounted on the rotating platform, and wherein the at least one magnet is positioned proximate the rotating platform.

7. The system of claim 1, wherein the first magnetic field sensor and the second magnetic field sensor are positioned proximate the rotating platform, and wherein the at least one magnet is mounted on the rotating platform.

8. The system of claim 1, wherein $\Theta_a$ is between approximately 120 degrees and 130 degrees.

9. The system of claim 1, wherein the at least one magnet is a radial ring magnet having P pole pairs.

10. The system of claim 9, wherein $\Theta_m$ is substantially equal to $(P*\Theta_a) \% 360$.

11. The system of claim 9, wherein P is an even number and wherein $\Theta_a$ is approximately 180 degrees.

12. The system of claim 9, wherein P is equal to 21.

13. The system of claim 9, wherein the radial ring magnet is centered on the axis of rotation of the rotating platform.

14. The system of claim 13, wherein the first magnetic sensor and the second magnetic sensor are positioned radially outward from the radial ring magnet.

15. The system of claim 1 further comprising a controller communicatively coupled to the first magnetic field sensor and the second magnetic field sensor.

16. The system of claim 15, wherein the controller is configured to determine a first change in magnetic field based on data from the first magnetic field sensor, determine a second change in magnetic field based on data from the second magnetic field sensor, and average the first change in magnetic field and the second change in magnetic field.

17. The system of claim 16, wherein the data from the first magnetic field sensor represents electrical resistance of the first magnetic field sensor.

18. The system of claim 16, wherein the data from the second magnetic field sensor represents electrical resistance of the second magnetic field sensor.

19. The system of claim 1, wherein the first magnetic field sensor and the second magnetic field sensor are magnetoresistive sensors.

* * * * *